United States Patent
Tao et al.

(10) Patent No.: US 6,933,605 B2
(45) Date of Patent: Aug. 23, 2005

(54) SEMICONDUCTOR PACKAGE

(75) Inventors: Su Tao, Kaohsiung (TW); Chi Tsung Chiu, Kaohsiung (TW); Sung Mao Wu, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 110 days.

(21) Appl. No.: 10/648,363

(22) Filed: Aug. 27, 2003

(65) Prior Publication Data

US 2004/0104462 A1 Jun. 3, 2004

(30) Foreign Application Priority Data

Dec. 3, 2002 (TW) ........................................ 91135502 A

(51) Int. Cl.[7] .............................................. H01L 23/34
(52) U.S. Cl. ........................ 257/728; 257/777; 257/783
(58) Field of Search ................................ 257/686, 728, 257/737, 777, 783, 787

(56) References Cited

U.S. PATENT DOCUMENTS

| | | | | |
|---|---|---|---|---|
| 5,717,249 A | * | 2/1998 | Yoshikawa et al. | 257/728 |
| 6,414,384 B1 | * | 7/2002 | Lo et al. | 257/685 |
| 6,740,980 B2 | * | 5/2004 | Hirose | 257/777 |

* cited by examiner

Primary Examiner—Leonardo Andújar

(57) ABSTRACT

A semiconductor package comprises a first chip, a substrate, a middle layer, a second chip, and an encapsulant. The first chip has an active surface and a high-frequency element defining a high-frequency area on the active surface. The substrate supports the first chip and is electrically connected to the first chip. The middle layer is disposed on the first chip and has a recess corresponding to the high-frequency area. The second chip is disposed on the middle layer and electrically connected to either the first chip or the substrate. The encapsulant encapsulates the first chip, the middle layer, the second chip, and a part of the substrate.

7 Claims, 3 Drawing Sheets

SEMICONDUCTOR PACKAGE

CROSS REFERENCE TO RELATED APPLICATION

This application claims the priority benefit of Taiwan patent application serial No. 091135502, filed on Dec. 3, 2002, and the full disclosure thereof is incorporated herein by reference.

BACKGROUND OF THE INVENTION

1. Field of the Invention

The present invention relates to a semiconductor package with a high-frequency element, and more particularly, to a semiconductor package with a cavity formed in the encapsulant corresponding to a high-frequency element thereof so as to avoid the influence of the encapsulant upon the high-frequency element.

2. Description of the Related Art

The package has four major functions, i.e. signal distribution, power distribution, heat dissipation, and protection. In general, the semiconductor chip is formed into an enclosure, such as a single-chip module (SCM) or a chip carrier, referred to as a first-level package, i.e. the packaging of the semiconductor. These packaged chips, along with other components such as capacitors, resistors, inductors, filters, switches, and optical and RF components, are assembled to a printed wiring board in a second-level package.

In the prior art, there exist varied packages, such as a small outline package (SOP), a quad flat package (QFP), a ball grid array (BGA) package, and so on.

Referring to FIG. 1, it depicts a typical ball grid array package 10. The package 10 generally has a substrate 14 and a chip 18 attached on the substrate 14 by an adhesive 28. The chip 18 is electrically connected to the substrate 14 through a plurality of bonding wires 16. An encapsulant 12 encapsulates the substrate 14, the chip 18, and the bonding wires 16. The substrate 14 further has a plurality of solder balls 24 for electrically connecting an external circuit.

The active surface 26 of the chip 18 typically directly touches the encapsulant 12. However, in a specific case, the chip 18 is provided with a high-frequency circuit or element disposed in a high-frequency area 20 on the active surface 26. The signal propagation speed Vp in the high-frequency element is derived from the following equation:

$$Vp = C/\sqrt{(\in_r)}$$

where C is the speed of light in vacuum and $\in_r$ is effective or equivalent dielectric constant. As the high-frequency element is exposed to air, the effective dielectric constant ranges from 1 (the dielectric constant of air) to 4 (the dielectric constant of G-10 or FR-4 substrate which is constructed from a woven glass fabric with an epoxy resin binder). However, while the high-frequency area 20 is covered with the encapsulant 12, the dielectric constant of the encapsulant 12 is larger than that of the air and thus the effective dielectric constant ranges from the dielectric constant of the encapsulant 12 to the dielectric constant of the substrate 14. Therefore, the effective dielectric constant of the substrate covered with the encapsulant 12 is larger than that of the substrate exposed to the air. Furthermore, the loss factor or loss tangent of the high-frequency circuit is also increased because of the covering of the encapsulant 12.

Accordingly, there exists a need for a semiconductor package which is provide with a cavity to prevent the high-frequency element from contacting the encapsulant and avoid the disadvantages due to the contact.

SUMMARY OF THE INVENTION

It is an object of the present invention to provide a semiconductor package with a cavity positioned above the high-frequency area of the semiconductor chip such that the propagation speed of the high-frequency circuit is not reduced.

In order to achieve the above object, the present invention provides a semiconductor package comprising a first chip, a substrate, a middle layer, a second chip, and an encapsulant. The first chip has an active surface and a high-frequency element defining a high-frequency area on the active surface. The substrate supports the first chip and is electrically connected to the first chip. The middle layer is disposed on the first chip and has a recess corresponding to the high-frequency area. The second chip is disposed on the middle layer and electrically connected to either the first chip or the substrate. The encapsulant encapsulates the first chip, the middle layer, the second chip, and a part of the substrate.

Accordingly, the high-frequency element of the semiconductor package according to the present invention is not covered with or touched by the encapsulant, and thus the propagation speed of the high-frequency element may not be reduced by the influence of the encapsulant. Furthermore, the high-frequency element is not covered with the encapsulant and thus the loss tangent thereof is not increased.

BRIEF DESCRIPTION OF THE DRAWINGS

Other objects, advantages, and novel features of the invention will become more apparent from the following detailed description when taken in conjunction with the accompanying drawing.

DESCRIPTION OF THE PREFERRED EMBODIMENT

Figure 1:
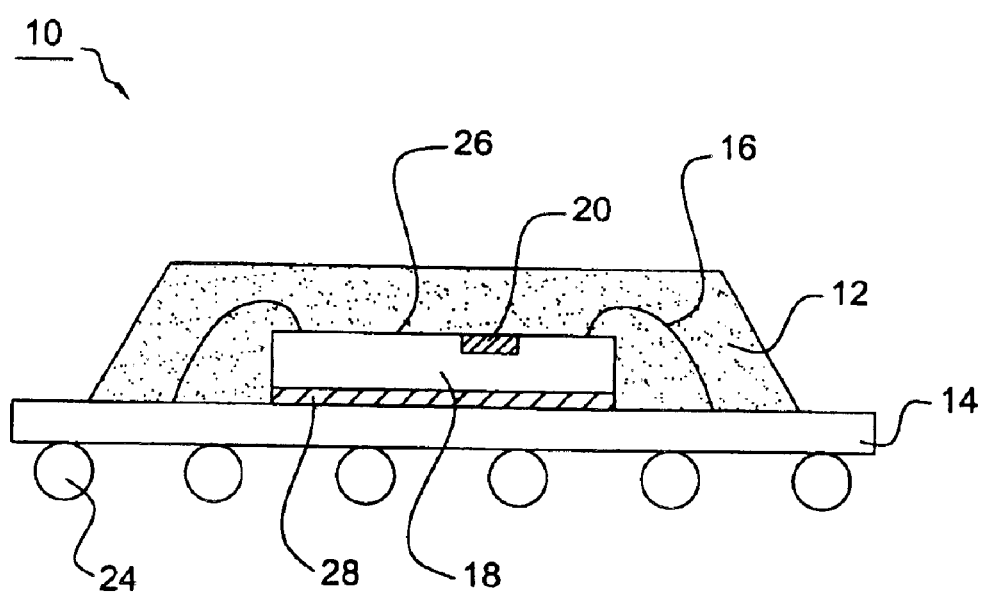
FIG. 1 is a schematic cross-sectional view of a semiconductor package in the prior art.
Figure 2:
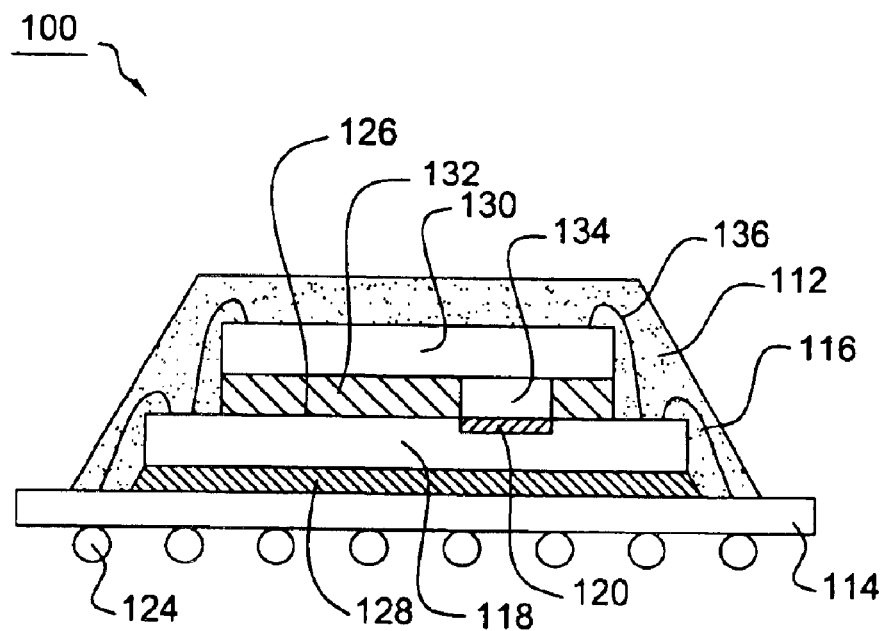
FIG. 2 is a schematic cross-sectional view of a semiconductor package according to an embodiment of the present invention.

Referring to FIG. 2, it depicts a semiconductor package 100 according to an embodiment of the present invention. The semiconductor package 100 is a multi-chip package and has a first chip 118 attached to a substrate 114 by an adhesive 128, and a second chip 130 disposed on the first chip 118.

The first chip 118 has an active surface 126 electrically connected to the substrate 114 by a plurality of bonding wires 116. The substrate 114 further has a plurality of solder balls 124 for connecting an external circuit. The first chip 118 has high-frequency circuits or elements disposed in a high-frequency area 120 on the active surface 126 of the first chip 118.

A middle layer 132 is disposed on the active surface 126 of the first chip 118 and has a recess 134 corresponding to the high-frequency area 120. The middle layer 132 can be an adhesive, such as made of epoxy, and be applied on the active surface 126 by screen-printing, thereby forming the recess 134. The second chip 130 is disposed on the middle layer 132 and electrically connected to the first chip by a plurality of bonding wires 136. An encapsulant 112 encapsulates the substrate 114, the first chip 118, the middle layer 132, the second chip 130, and the bonding wires 116 and 136.

In this arrangement, the high-frequency area 120 of the first chip 118 is exposed to the recess 134, so the propagation speed of the high-frequency element in the high-frequency area 120 is free from the influence of the encapsulant 112 and thus is not reduced. Furthermore, without being covered by the encapsulant 112, the loss tangent of the high-frequency element is not increased. It should be noticed that the recess 134 shown in the drawing is a through hole, but the recess 134 is used for providing a space above the high-frequency area and can be a non-through hole, i.e. Ea depression.

Figure 3:
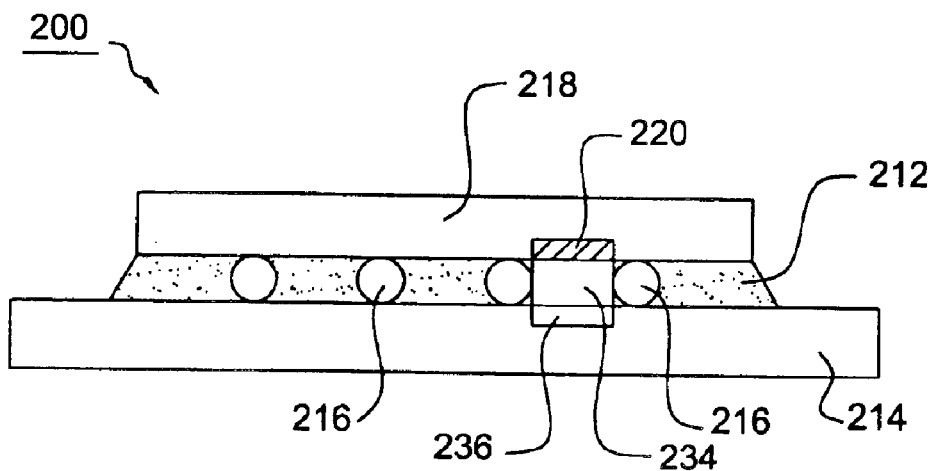
FIG. 3 is a schematic cross-sectional view of a semiconductor package according to another embodiment of the present invention.

Referring to FIG. 3, it depicts a semiconductor package 200 according to another embodiment of the present invention. The semiconductor package 200 is a type of flip chip package and has a chip 218 having an active surface 226 which is electrically connected to a substrate 214 by bumps 216. An encapsulant 212 is filled between the active surface 226 of the chip 218 and the substrate 214 by the under fill dispensing process. The substrate 214 is adapted for electrically connecting an external circuit.

The chip 218 has a high-frequency circuit or element disposed in a high-frequency area 220 on the active surface 126 of the first chip 118. As shown in the drawing, the active surface 226 of the chip 218 faces the substrate 214. The encapsulant 212 has a cavity 234 (a through hole shown in the drawing), the position of which is corresponding to that of the high-frequency area 220. In this arrangement, the high-frequency area 220 is exposed to the cavity 234, so the propagation speed of the high-frequency element in the high-frequency area 220 is free from the influence of the encapsulant 212 and is not reduced.

It will be apparent to those skilled in the art that the cavity 234 or the through hole can be formed by dispensing and performing a dam (not shown).

Furthermore, the substrate 214 can be provided with a notch 236 disposed thereon corresponding to the high-frequency area 220 for increasing the volume of the space above the high-frequency area 220 and further reducing the influence upon the high-frequency area.

Figure 4:
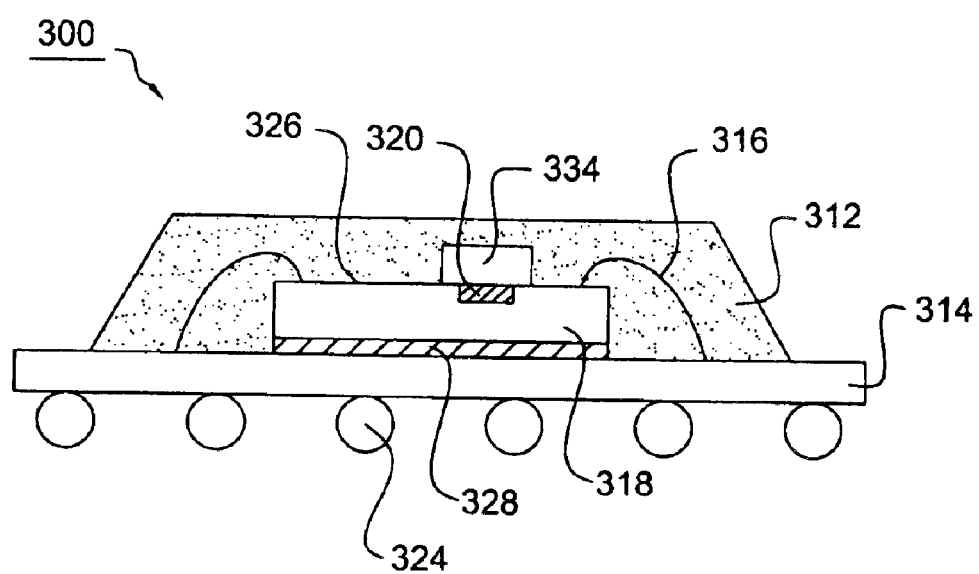
FIG. 4 is a schematic cross-sectional view of a semiconductor package according to a further embodiment of the present invention.

Referring to FIG. 4, it depicts a semiconductor package 300 according to a further embodiment of the present invention. The semiconductor package 300 has a chip 318 which is attached to the substrate 214 by an adhesive layer 328. The chip 318 has an active surface 326 which is electrically connected to the substrate 314 by a plurality of bonding wires 316. The substrate 14 is further provided with a plurality of solder balls 324 for connecting an external circuit.

The chip 318 has a high-frequency circuit or element disposed in a high-frequency area 320 on the active surface 326 of the chip 318. An encapsulant 312 encapsulates the substrate 314, the chip 318, and the bonding wires 316. As shown in the drawing, the encapsulant 312 has a cavity 334 corresponding to the high-frequency area 320. It will be apparent to those skilled in the art that the cavity 334 can be formed in the encapsulant 312 by pre-locating a lip (not shown) thereon and then molding the encapsulant 312.

It will be apparent to those skilled in the art that the principle and spirit of the present invention is that a space positioned above the high-frequency element of a semiconductor chip is provided such that the influence upon the operation of the high-frequency element is avoided. The principle of the present invention is not limited to be applied to the embodiments shown in the drawings and can be applied to other packages, such as small outline packages, quad flat packages, ball grid array packages and so on. The above-mentioned substrate can be easily replaced with a lead frame.

As mentioned above, the high-frequency element of the semiconductor package according to the present invention is not covered with or touched by the encapsulant, and thus the propagation speed of the high-frequency element may not be reduced by the influence of the encapsulant. Furthermore, the high-frequency element is not covered with the encapsulant and thus the loss tangent thereof is not increased.

While the foregoing description and drawings represent the preferred embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A semiconductor package comprising:
   a first chip defining an active surface and having a high-frequency element defining a high-frequency area on the active surface;
   a substrate supporting the first chip and electrically connected to the first chip;
   a middle layer disposed on the first chip and having a recess corresponding to the high-frequency area; and
   a second chip disposed on the middle layer and electrically connected to one of the first chip and the substrate.

2. The semiconductor package as claimed in claim 1, further comprising an encapsulant encapsulating the first chip, the middle layer, the second chip, and a part of the substrate.

3. The semiconductor package as claimed in claim 1, wherein the substrate further comprises a plurality of solder balls for electrically connecting an external circuit.

4. The semiconductor package as claimed in claim 1, further comprising:
   a plurality of bonding wires for electrically connecting the first chip to the substrate.

5. The semiconductor package as claimed in claim 1, further comprising:
   a plurality of bonding wires for electrically connecting the second chip to the first chip.

6. The semiconductor package as claimed in claim 1, further comprising:
   a plurality of bonding wires for electrically connecting the second chip to the substrate.

7. The semiconductor package as claimed in claim 1, wherein the recess is a through hole.

* * * * *